(12) United States Patent
Bloomstein et al.

(10) Patent No.: US 6,641,268 B2
(45) Date of Patent: Nov. 4, 2003

(54) INTERFEROMETRIC PROJECTION SYSTEM

(75) Inventors: Theodore M. Bloomstein, Brookline, MA (US); Michael Switkes, Somerville, MA (US); Mordechai Rothschild, Newton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/994,147

(22) Filed: Nov. 26, 2001

(65) Prior Publication Data

US 2002/0149751 A1 Oct. 17, 2002

Related U.S. Application Data

(60) Provisional application No. 60/272,506, filed on Feb. 28, 2001.

(51) Int. Cl.[7] .............................. G01B 9/02; G03B 21/14
(52) U.S. Cl. ...................... 353/94; 353/122; 356/521
(58) Field of Search .......................... 353/22, 94, 121, 353/122; 359/583, 584; 356/508, 519, 521, 494; 355/67

(56) References Cited

U.S. PATENT DOCUMENTS 5,771,098 A 6/1998 Ghosh et al. ............... 356/363
5,959,725 A 9/1999 Ghosh ....................... 356/121
2001/0035991 A1 11/2001 Hobbs et al. ................ 359/35

OTHER PUBLICATIONS

Switkes, et al., "*Patterning of sub–50 nm dense features with space–invariant 157 nm interference lithography*", Appl. Phys. Lett., vol. 77, No. 20, (Nov. 13, 2000), pp. 3149–3151.

Savas, et al., "*Large–area achromatic interferometric lithography for 100 nm period gratings and grids*", J. Vac. Sci. Technol. B1 4(6), (Nov./Dec. 1996), pp. 4167–4170.

Anderson, et al., "*Achromatic holographic lithography in the deep violet*", J. Vac. Sci. Technol.Bb(1), (Jan./Feb. 1998), pp. 216–218.

Hinsberg, et al., "*Deep–ultraviolet interferometric lithography as a tool for assessment of chemically amplified photoresist performance*", J. Vac. Sci. Technol.B16(6), (Nov./Dec. 1998), pp. 3689–3694.

*Primary Examiner*—William Dowling
(74) *Attorney, Agent, or Firm*—Wolf, Greenfield & Sacks, P.C.

(57) ABSTRACT

An interference projection system for use with lithography using quasi-coherent sources, which has a non-diffractive beam splitting module and a non-diffractive module to cause interference of two or more beams, the modules combining to form interfering beams having the same orientation on a target surface. Two etalons are used to split a beam, to form two beams of the same orientation, strength and polarization. One or more pairs of mirrors cause the beam to interfere.

22 Claims, 6 Drawing Sheets

INTERFEROMETRIC PROJECTION SYSTEM

RELATED APPLICATIONS

This application claims priority from U.S. provisional application 60/272,506, to Bloomstein, et al., filed Feb. 28, 2001, the subject matter of which is incorporated herein by reference.

This invention was made with government support under contract no. F 19628-00-C-0002. The government has certain rights in this invention.

BACKGROUND OF THE INVENTION

1. Field of Invention

This invention relates to interferometric systems, and more particularly to interferometric projection systems for quasi-coherent radiation.

2. Related Art

Interference lithography (IL) is a maskless, lensless interferometeric projection technique capable of patterning the smallest possible features at a given exposure wavelength. In IL systems, two mutually coherent (or quasi-coherent) beams intersect at a photosensitve surface (e.g., a resist-coated substrate), creating a line and space pattern with a period as small as ½ the wavelength of the incident light. IL has found commercial applications where generation of repetitive patterns is desired (e.g., the manufacture of gratings for diffractive optics, and field emitter arrays for electronic circuitry, and the evaluation and development of photoresist materials). Applications that require more complex pattern generation, such as the patterning of magnetic recording media, are in the research and development stages.

As state of the art photolithography has come to rely on excimer laser sources at wavelengths $\lambda$=248, 193, and 157 nm, the implementation of interference lithography has become more complicated. These lasers produce intense ultraviolet radiation, but have poor lateral spatial coherence, typically on the order of tens of micrometers, and also have significant beam pointing instabilities. Light sources having limited spatial coherence, such as excimer lasers, are referred to as quasi-coherent sources.

In conventional IL systems, which include a beam splitter and two mirrors, the useable field size over which an interference pattern is generated is limited to a size equal to the lateral spatial coherence length of the laser. As stated above, the lateral spatial coherence length of quasi coherent sources such as excimer lasers is only on the order of tens of micrometers; accordingly, the size of the pattern generated by such systems is impracticably small for many applications. Also, such conventional IL systems are particularly sensitive to the beam pointing instabilities inherent in excimer lasers. One such conventional IL system is described in the publication, "Deep-ultraviolet Interferometric Lithography as a Tool for Assessment of Chemically Amplified Photoresist Performance," (Journal of Vacuum Science and Technology, B 16(5), November/December 1988), by W. Hinsberg, et al.

To overcome these limitations, interferometric projection systems based on diffractive optics have been demonstrated. An example of an interferometric projection system based on diffractive optics is disclosed in the publication, "Large-area Achromatic Interferometric Lithography for 100 nm Period Gratings and Grids" (Journal of Vacuum Technology, B 14(6), November/December 1996), by T. A. Savas, et al. Such diffractive systems include a diffraction grating that splits a laser beam into two beams. Each of the two beams so generated is diffracted by another diffraction grating to cause the beams to intersect to form an interference pattern. The period of the pattern generated is half the period of the diffraction gratings used to cause the interference.

In diffractive systems, the field over which the interference pattern is generated is not limited by lateral coherence length, however interferometric projection systems based on diffractive optics have limitations. For example, the quality of the interference pattern produced by such a grating is limited by the quality of the diffraction gratings that cause the beams to intersect and the degree to which the diffraction gratings are matched. That is, the quality of the pattern generated is affected by the absolute accuracy of the spacing of the gratings elements that comprise the gratings, and the degree to which the spacing of the grating elements of one grating match the spacing of the other grating.

In addition to component-level limitations and constraints, such diffractive interference systems have system-level limitations. For example, the interference pattern frequency generated by a diffractive system is fixed by the grating period of the diffractive optical elements employed in the system. To change the interference pattern frequency, diffractive elements having an appropriate frequency and quality must be fabricated and employed.

SUMMARY OF THE INVENTION

Unlike conventional interferometric projection systems, the size (i.e., area) of the projected interference patterns generated by interferometric systems according to the present invention are not limited by the lateral coherence length of the light source, and because interference projection systems according to the present invention are non-diffractive, the patterns generated are not limited by the precision and size of a grating structure. Rather, the fundamental limit on the size of the projected pattern is based on the temporal coherence length of the source and/or the beam size projected onto the photosensitive surface. Additionally, compared to diffractive interferometric projection systems, exemplary embodiments of the present design provide an ability to change the period of the exposed pattern by simply changing the position of elements of the system, rather than by the fabrication of new gratings as required in diffractive systems.

A first aspect of the invention is an interference projection system having an input beam, comprising a non-diffractive first module which reflects and refracts the input beam, and splits the input beam into a first beam and a second beam, and a non-diffractive second module which causes the first beam and the second beam to interfere at a surface, the first and second modules combining to have the first beam and the second beam reach the surface with the same orientation. Optionally, at the first module output, the first beam and the second beam propagate in substantially parallel directions, and at the first module output the first beam and the second beam have traversed substantially the same optical path length. In one embodiment of the first aspect of the invention, at the first module output, the first beam and the second beam have the same orientation. In a second embodiment, the first module TE polarizes both the first beam and the second beam. In a third embodiment, the second module includes a first mirror to reflect the first beam, and a second mirror to reflect the second beam. In a fourth embodiment, the second module includes a first pair of mirrors to reflect the first beam, and a second pair of mirrors to reflect the second beam.

A second aspect of the invention is an interference projection system having an input beam, comprising a first etalon having a first etalon front surface and a first etalon back surface, the first etalon back surface being separated from the first etalon front surface, the first etalon being oriented relative to the input beam to split the beam into a first beam and a second beam, a second etalon having a second etalon front surface and second etalon back surface, the second etalon back surface being separated from second etalon front surface, the second etalon being oriented relative to first beam and the second beam to reflect the first beam and second beam, and a first pair of mirrors oriented to cause the first beam and the second beam to interfere at a surface, the first pair of mirrors comprising a first mirror oriented to reflect the first beam and a second mirror oriented to reflect the second beam, the first etalon, second etalon, and first pair of mirrors, being selected and arranged to have the first beam and second beam have the same orientation at the surface.

A third aspect of the invention is a method of projecting an interference pattern, comprising (a) projecting a beam, (b) non-diffractively dividing the beam by reflecting and refracting the beam to produce a first beam and a second beam, and (c) intersecting the first beam and second beam to form an interference pattern at a surface, the dividing and intersecting steps combining to have the first beam and second beam reach the surface with the same orientation. Optionally, the first beam and the second beam produced during the dividing step propagate in substantially parallel directions, and at a plane normal to the directions, have traversed substantially the same optical path length. In one embodiment of the third aspect of the invention, the first beam and second beam produced by the dividing step are TE polarized.

BRIEF DESCRIPTION OF THE DRAWINGS

Illustrative, non-limiting embodiments of the present invention will be described by way of example with reference to the accompanying drawings, in which the same reference numeral is used for common elements in the various figures, and in which.

DETAILED DESCRIPTION OF THE INVENTION

Figure 1:
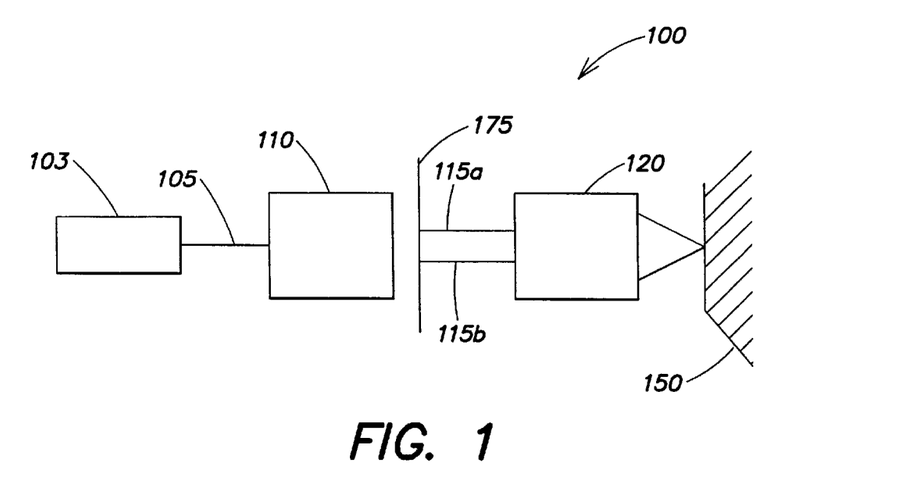
FIG. 1 is a functional block diagram of one example of an embodiment of an interference projection system according to the present invention.

FIG. 1 is a functional block diagram of a non-diffractive interference projection system 100 according to the present invention. Interference projection system 100 comprises a non-diffractive first module 110, a non-diffractive second module 120, and a light source module 102. A non-diffractive system or module is a system or module that does not contain a diffractive optical element (e.g., a diffraction grating).

Light source module 102 generates an input beam 105. Light source module 102 generates at least quasi-coherent illumination. For example, light source module 102 can include a lamp or a laser light source. In one embodiment, light source module 102 includes an excimer laser. Preferably, light source module 102 provides collimated light.

Non-diffractive first module 110 reflects and refracts input beam 105, and splits input beam 105 into a first beam 115a and a second beam 115b. Second module 120 causes first beam 115a and second beam 115b to interfere at a photosensitive surface 150. Photosensitive surface 150 can be any known photosensitive surface, e.g., a photographic film or a photolithographic resist.

As one of ordinary skill would understand, to cause an interference pattern to occur, first beam 115a and the second beam 115b traverse substantially the same optical path length to the photosensitive surface 150. The phrase "substantially the same optical path length" shall herein mean having an optical path length difference of less than the temporal coherence length of the source (or sources) that produce the relevant beams. As described in greater detail with reference to FIG. 4, first module 110 and second module 120 combine to have the first beam 115a and the second beam 115b reach the photosensitive surface 150 with the same orientation.

In one embodiment of interference projection system 100, at the output of the first module 110, the first beam 115a and the second beam 115b propagate in substantially parallel directions, and at a plane 175 normal to such directions, the first beam and the second beam have traversed substantially the same optical path length. Preferably, at the output of first module 110, the first beam 115a and the second beam 115b have the same orientation, and preferably, first module 110 TE polarizes both the first beam 115a and the second beam 115b.

Figure 2:
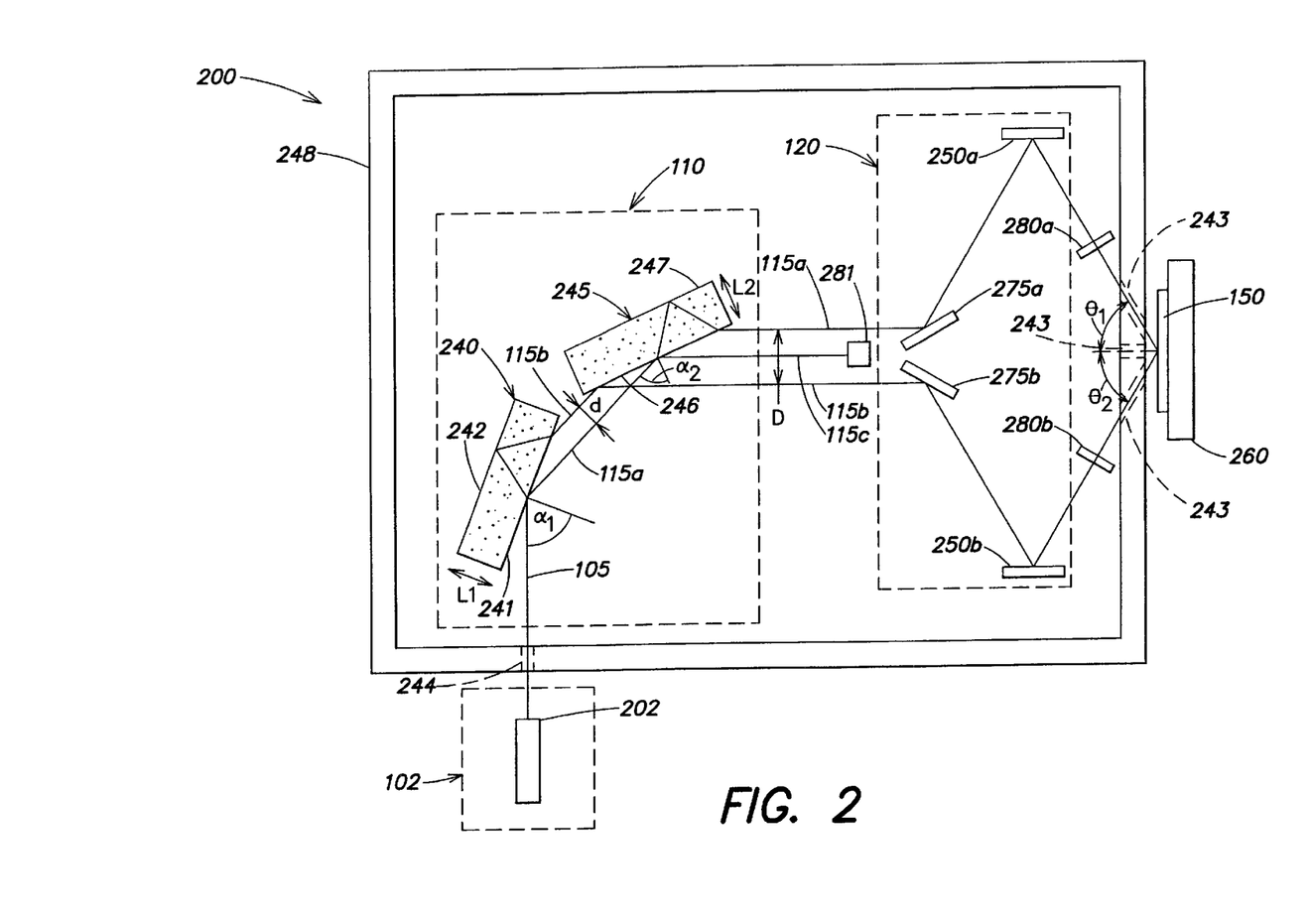
FIG. 2 is a schematic illustration of one example of one embodiment of an interference projection system according the present invention.

FIG. 2 is a schematic illustration of one example of an interference projection system 200 according to the present invention. Input beam 105 from a source 202 in light source module 102 enters lithographic system 200, and generates an interference pattern at photosensitive surface 150. In one embodiment, photosensitive surface 150 is mounted on a precision translation stage 260. Translation of a translation stage 260 allows multiple fields of photosensitive surface 150 to be exposed to the interference pattern.

First module 110 includes a first etalon 240 and a second etalon 245. For example, etalons 240, 245 may be a pair of optical flats, each etalon 240, 245 having a front surface 241, 246 and a back surface 242, 247; however, this is not a limitation on the invention and such beam separation may in fact be performed by substantially any pair of etalons. In one embodiment of interference projection system 200, etalons 240, 245 are substantially identical.

For purposes of this invention, the term "etalon" is defined as a pair of separated, substantially parallel, and substantially planar surfaces, the space between the surfaces being filled with a medium having a known and substantially uniform index of refraction, the front surface being partially reflecting and the back surface being either partially or fully reflecting. To the extent the back surfaces of the optical flats or etalons used are not fully reflecting, some light (not shown) will pass through these surfaces; however, this light does not have any effect on the system optics.

Input beam 105 from source 202 is projected onto first etalon 240 to generate two beams 115a and 115b. First etalon 240 has a front surface 241 and a back surface 242. First etalon front surface 241 and first etalon back surface 242 are separated by a distance $L_1$ (i.e., $L_1$ is the thickness of first etalon 240). First etalon 240 is oriented relative to input beam 105 to split the input beam 105 into a first beam 115a and a second beam 115b separated by a distanced, as measured in the direction perpendicular to first beam 115a and second beam 115b. Beams 115a and 115b are initially generated at front surface 241.

As one of ordinarily skill would understand, at any surface traversed by beams 115a, 115b, a portion of the beams 115a, 115b may be partially transmitted and partially reflected, thus forming two beams. For the purpose of this invention, the relevant portion of a beam so transmitted and reflected will be labeled 115a, 115b. For example, at the output of etalon 240 (i.e., at surface 242), first beam 115a is the product of reflecting input beam 105 from the first etalon front surface 241, and second beam 115b is the product of transmitting input beam 105 through first etalon front surface 241 and reflecting the transmitted portion from back surface 242. As one of ordinary skill in the art would understand, additional beams (not shown) that are insignificant for the present invention may be generated. Also, as one of ordinary skill would understand, offset distance d at the output of etalon 240, is determined by angle $\alpha_1$ at which input beam 105 strikes surface 241, thickness $L_1$, and the index of refraction of etalon 240.

Beams 115a and 115b are directed toward second etalon 245. Beam 115b is reflected from front surface 246 of second etalon 245, and beam 115b is reflected from back surface 247 of etalon 245. Etalon 245 generates a third beam 115c. Beam 115c is the product of reflecting beam 115a from the front surface 246 of second etalon 245.

As one of ordinary skill would understand, offset distance D is determined by first etalon 240 (i.e., the angle $\alpha_1$ of first etalon 240 relative to beam 105, the thickness $L_1$, and the index of refraction $n_2$ of first etalon 240) and by second etalon 245 (i.e., angle $\alpha_2$ of second etalon 245 relative to beam 105, the thickness of second etalon $L_2$, and the index of refraction $n_2$ of second etalon 245). In one embodiment, angles $\alpha_1$ and $\alpha_2$ are equal, thicknesses $L_1$ and $L_2$ are equal, and indices of refraction $n_1$ and $n_2$ are equal. Accordingly, first beam 115a and the second beam 115b emerge from second etalon 245 having traversed the same optical path length, and first beam 115a and the second beam 115b emerge from the second etalon 245 having substantially the same signal strength, and first beam 115a and the second beam 115b emerge from the second etalon 245 traveling in parallel directions. Also, in this embodiment D is equal to two times d.

Optionally, the transmission of interference system 200 can be increased by the use of appropriate optical coatings on surfaces 241, 242, 246, 247 of the etalons 240, 245. In one embodiment, rear surfaces 242, 247 are coated with fully reflective coatings, and front surfaces 241, 246 are coated with partially reflecting coatings, each having a transmission of 2/3.

In some embodiments of interferometric projection system 200, first beam 115a and second beam 115b are TE polarized to increase the contrast of the interference pattern generated at photosensitive surface 150. In one embodiment of the invention, first beam 115a and second beam 115b are substantially TE polarized by selecting $\alpha_1$ and $\alpha_2$ to be substantially equal to Brewster's angle. For example, by selecting $\alpha_1$ equal to 67.5 degrees and $\alpha_2$ equal to 67.5 degrees, first beam 115a and the second beam 115b emerge from the second etalon 245 at the output of the first module 110 substantially TE polarized, and propagating 90 degrees relative to input beam 105.

Second module 120 includes a first pair of mirrors 250a, 250b oriented to cause the first beam 115a and the second beam 115b to interfere at a photosensitive surface 150. First mirror 250a is oriented to reflect the first beam 115a, and second mirror 250b oriented to reflect the second beam 115b. A second pair of mirrors 275a and 275b is oriented to cause the first beam 115a and the second beam 115b to spatially separate prior to reflection from first pair of mirrors 250a, 250b. First mirror 275a is oriented to reflect first beam 115a, and second mirror 275b is oriented to reflect the second beam 115b. Although many mirror arrangements are possible, beams 115a and 115b are made to have the same orientation by having the same number of reflections occur to beam 115a and beam 115b. Optionally, second pair of mirrors 275 may be excluded and first pair of mirrors 250 can be positioned to cause beams 115a and beam 115b to interfere.

As described in greater detail below, embodiments of second module 120 having second pair of mirrors 275a, 275b provide decreased sensitivity to vibration and input beam 105 alignment. Also, embodiments of second module 120 having second pair of mirrors 275a, 275b allow the working distance (i.e., the distance between first pair of mirrors 250a, 250b and surface 150) to be increased, and allow the pitch of the interference pattern formed on the surface 150 to be varied by a combination of rotation of mirrors 275a, 275b and translation of mirrors 250a, 250b while allowing generation of an interference pattern at a fixed location (i.e., the location of surface 150 remains fixed, regardless of the pitch).

Optionally, shutters (or attenuators) 280a and 280b may be added to allow beams 115a and 115b to be blocked, for example, for alignment purposes, thus allowing flood exposure with one of beams 115a and 115b. Beams 115a or 115b may also be blocked or attenuated to reduce the total interference pattern contrast, such as for resist evaluation purposes.

In the illustrated embodiment, beam 115c is blocked by a beam shutter 281. However, in other embodiments, beam 115c may be used in generating the interference pattern at surface 150. In one embodiment, the optical path length traversed by beam 115c to surface 150 is made to be substantially equal to beams 115a and 115b (e.g., by an optical flat crystal having the proper index, or by other known means), and the beam is attenuated by a suitable optical attenuator to have substantially the same strength as beams 115a and 115b.

The interference projection systems 200 is contained in a housing 248 which provides a mechanical base for the optical components. Housing 248 has an aperture 241 to allow passage of input beam 105. Housing 248 may also be used to contain any inert gas used to purge the system, as is the standard practice in lithographic systems operating at wavelengths below 250 nm. Housing 248 rests on translation and rotation stages (not shown) to align the system 200 with the source beam 202. Further, the whole assembly may be supported by a vibration isolation system (not shown), as is customary in lithographic systems.

Although embodiments of the interference projection system 200 discussed above have first modules 110 configured such that first beam 115a and the second beam 115b emerge from first module 110 having traversed substantially the same optical path length, having substantially the same signal strength, and traveling in parallel directions, the optics of second module 120 or additional optics (not shown) can be configured to compensate if the first beam 115a and second beam 115b emerge from first module 110 having traversed other than the same optical path length, or if first beam 115a and the second beam 115b emerge from first module 110 having other than substantially the same signal strength, or if first beam 115a and the second beam 115b emerge from first module 110 traveling in other than parallel directions. An example of one such embodiment, includes a first module 110 having only a single etalon. One of ordinary skill would understand that the optics of second module 120 can be selected and positioned to compensate for the fact that at the output of first module 110, first beam 115a and second beam 115b have traversed other than the same optical path length, and similarly optics of second module 120 can be selected and positioned to compensate for differences in beam strength, direction, and polarization, as necessary.

Beams 115a and 115b and optionally beam 115c exit housing 248 through output apertures 243. In one embodiment, these are simply holes in the wall of the housing 248 large enough to allow beams 115a, 115b, and 115c to pass. Embodiments with holes have the advantage of allowing any purge gas to flow through these holes to fill the space between the instrument housing 248 and the surface 150. In other embodiments, the system is closed (i.e., there are no holes). In such embodiments, transparent windows serve as output apertures 243 and a separate purging system can be added in the space between the instrument housing 248 and the sample surface 150.

Optionally, the interference pattern generated at surface 150 can be modulated. For example, a suitable mask (not shown) may be placed in the path of one or more of beams 105, and 115a, b or a mask may be formed on one or more of the mirrors 250, 275, and shutters 280a–b. Any of these exemplary structures may be used to selectively pattern or modulate the interference pattern formed on surface 150.

As in any precision optical instrument, some degree of alignment of system 200 may be necessary after assembly to correct for the mechanical tolerances of the machining process used to fabricate the optical housing, mounts, and insertion points. It is envisioned that at least one of mirrors 250a, b is mounted on a precision moveable mirror mount (not shown).

For example, for coarse alignment, a pin-hole (not shown) can be moved into the center of the input beam 105. The position of each beam 115a and 115b can be observed either on surface 150 using suitable imaging optics (e.g., a stereomicroscope and 45 degree reflector), or through the backside of a transparent surface 150. In either case, the surface 150 can be coated with a fluorescent material to improve the detectability of beams 115a and 115b. For fine alignment, a suitably sensitive resist at the source wavelength can be used as surface 150 and patterned by sweeping one beam 115a, 115b across the other and recording the angle at which the sharpest interference pattern features are produced. This is the equivalent of a focus array which is routinely performed on projection-based lithographic systems. Alternatively, more sophisticated methods utilizing aerial image sensors can also be employed.

Figure 3:
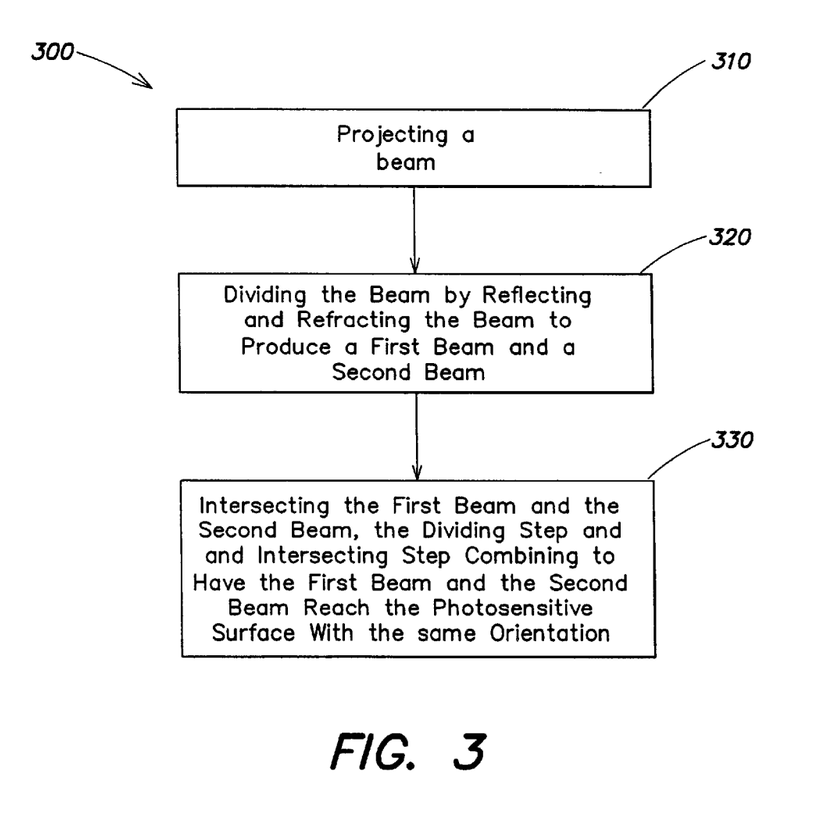
FIG. 3 is a flow chart of one example of a method for projecting an interference pattern according to the present invention.

FIG. 3 is a flow chart of an example of a method 300 of projecting an interference pattern according to the present invention. At block 310, a beam is projected. At block 320, the beam is non-diffractively divided by reflecting and refracting the beam to produce a first beam and a second beam.

Optionally, the first beam and the second beam, produced during dividing step, propagate in substantially parallel directions, such that at a plane normal to the directions, the first beam and second beam have traversed substantially the same optical path length. Optionally, the first beam and second beam produced by the dividing step are TE polarized.

At step 330, the first beam and the second beam are non-diffractively intersected to form an interference pattern at a photosensitive surface. Dividing step 320 and intersecting step 330 combine to have the first beam and second beam reach the photosensitive surface with the same orientation.

Interference projection systems according to the present information may be better understood by further understanding the operation and performance of such systems. In interference projection systems, a pattern is formed by the interference of at least two electromagnetic plane waves corresponding to at least two corresponding beams (corresponding to beams 115a and 115b in FIG. 2), the beams being at least quasi-coherent. In the case of two beams, the time-averaged intensity, I, at a point in the region where the two beams overlap is given by the sum of the electric fields squared:

$$I=|E_1\exp[i(k_1\cdot r_1)]+E_2\exp[i(k_2\cdot r_2+\phi)]|^2; \quad \text{equation 2}$$

where k is the propagation vector for each beam, r is the vector describing the light path from the source to the intersection point in question, and $\phi$ is a fixed phase difference between the two beams. For two beams of equal intensity $I_0$, equation 2 simplifies to:

$$I=I_0 \cos^2(\pi\Delta L/\lambda); \quad \text{equation 3}$$

where $\Delta L=k_1\cdot r_1-k_2\cdot r_2$ represents the difference in length between the optical paths traversed by the beams, and $\lambda$ is the wavelength of the interfering beams of light. If the beams intersect at angles to the normal $\theta_1$ and $\theta_2$ (visible in FIG. 2), the path length difference along the line of intersection can be calculated from geometrical identities and equation 3 simplifies to $$I(y)=I_0\cos^2(\pi y/\Lambda); \quad \text{equation 4}$$

where the period of the interference pattern is $$\Lambda = \frac{\lambda}{\sin\theta_1 + \sin\theta_2}; \quad \text{equation 5}$$

and y is the distance along the line of intersection of the sample and the plane of the incident beams.

Figure 4:
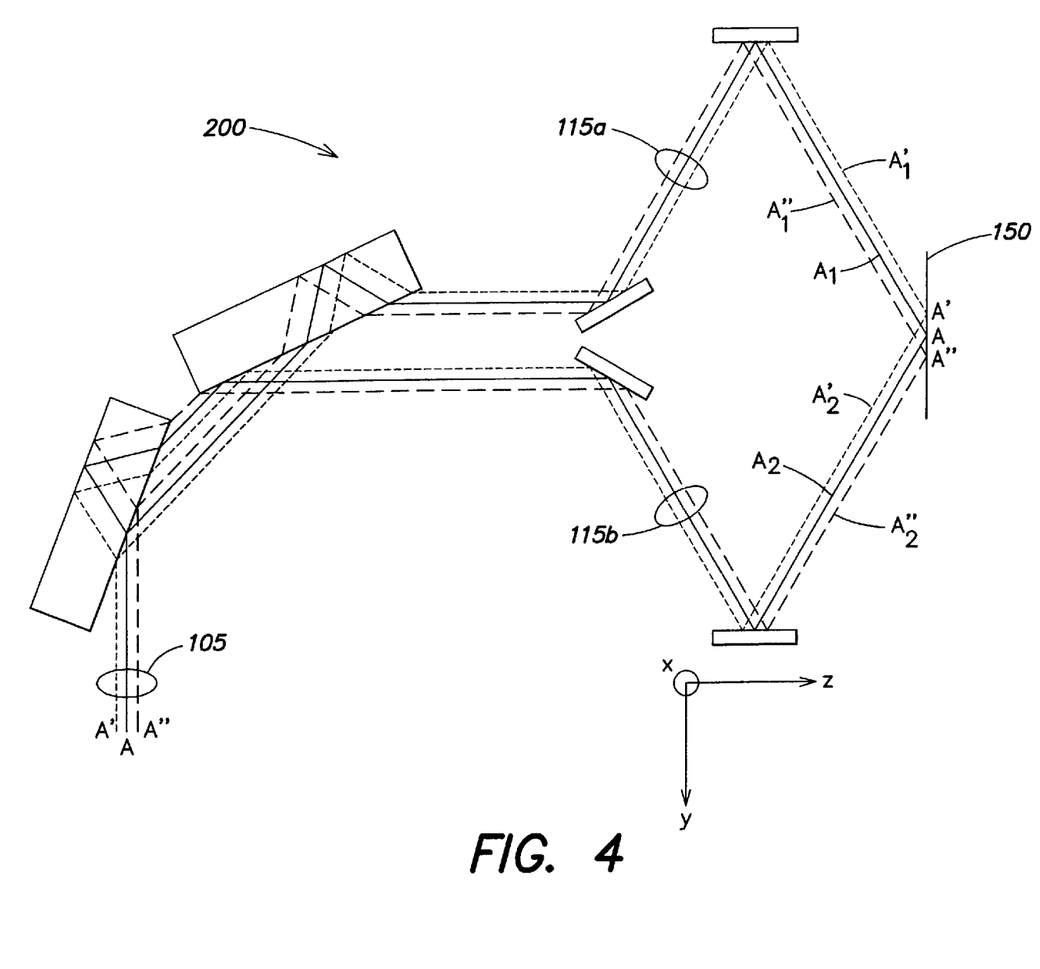
FIG. 4 is a schematic ray diagram of one example of an embodiment of an interference projection system according to the present invention.

FIG. 4 is a schematic ray diagram of an interference projection system 200 according to the present invention. FIG. 4 illustrates that beams 115a and 115b intersect at surface 150 such that points $A_1'$ and $A_1''$ on beams 115a intersect with points $A_2'$, and $A_2''$ on 115b, respectively. That is, beams 115a and 115b have the same orientation. Points $A_1'$, and $A_2'$ are generated from point A' on input beam 105, and points $A_1''$, and $A_2''$ are generated from point A" on input beam 105.

For intersecting beams having the same orientation, by aligning beams 115a and 115b to have the center rays $A_1$ and $A_2$ intersect at surface 150, points of intersection along the beam widths of beams 115a and 115b (i.e., in the y-direction at surface 150) are also made to align; therefore, at a given point of intersection on surface 150, the ray from beam 115a and ray from beam 115b are generated from points on input beam 105 that are within the lateral spatial coherence length. As described with reference to FIG. 5a, the length of the interference pattern in the y-direction is determined by the temporal coherence of the source.

Interferometric projection systems relying on pulsed excimer sources to generate input beam 105 typically utilize multiple pulses (usually on the order of fifty) to provide accurate dose control and average out pulse to pulse variations in the energy distribution of the beam. Accordingly, at surface 150, the intersecting points of the beams of such systems preferably emanate from points on input beam 105 that are separated by a distance in the z-direction that is within the lateral coherence length of the source to prevent a random phase from being added to the resulting electric field on a pulse-by-pulse basis, causing a shifting of the interference pattern and restricting operation to single pulses.

In contrast to systems according to the present invention, in conventional interference projection systems, such as the system described in the publication, "Deep-ultraviolet Interferometric Lithography as a Tool for Assessment of Chemically Amplified Photoresist Performance," (Journal of Vacuum Science and Technology, B 16(5), November/December 1988), by W. Hinsberg, et al., the beams intersecting the form the interference pattern do not have the same orientation in the y-direction at surface 150 (i.e., any two rays which intersect at the image plane emanate from points on opposite sides of the central ray A). In such systems, only light rays falling within a distance of ½ the spatial coherence length of the source from the central ray A can be used for interference. Accordingly, such systems have interference patterns of very limited size for quasi-coherent sources such as excimer lasers.

Figure 5A:
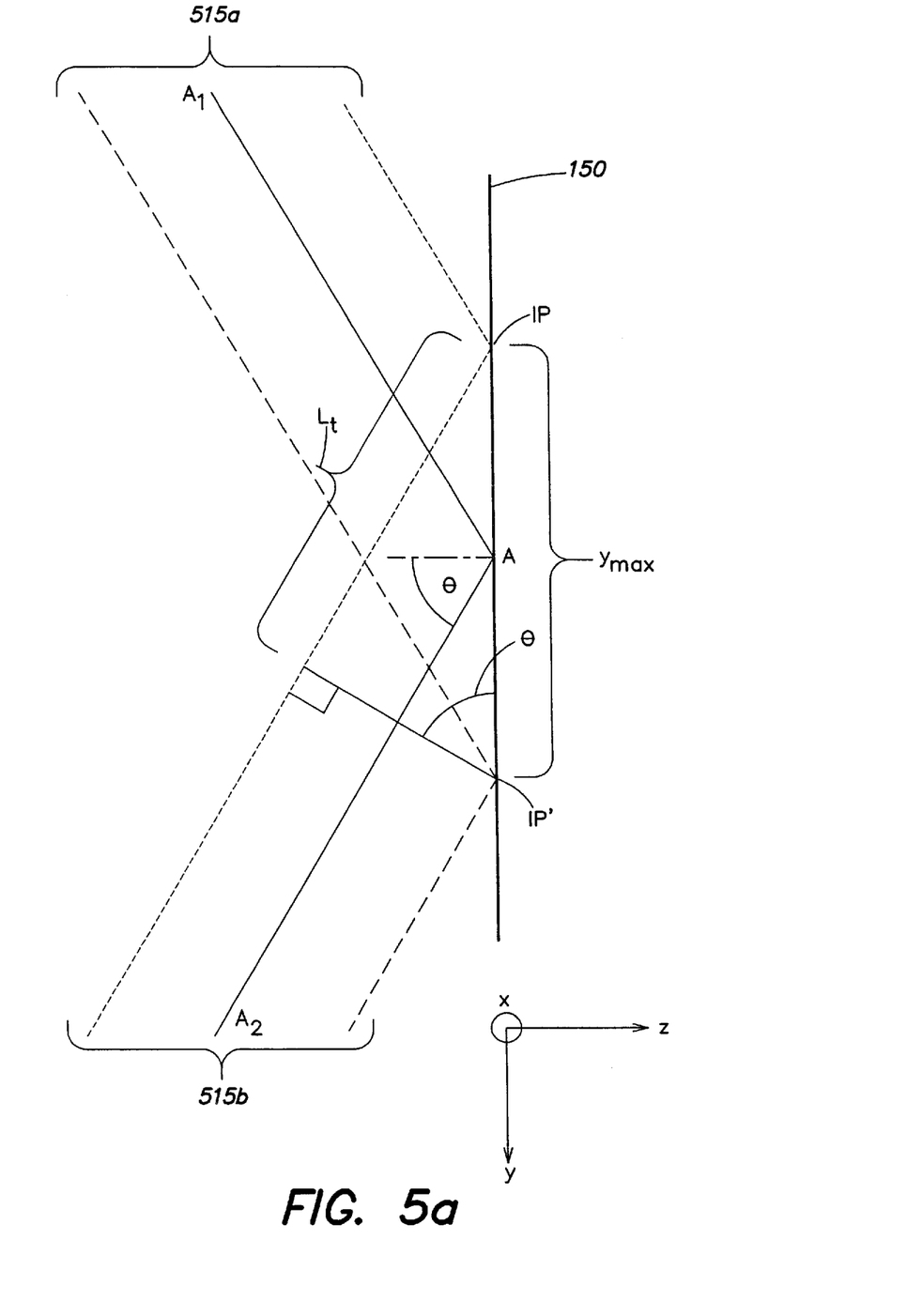
FIG. 5a is a schematic ray diagram illustrating the maximum lateral field size achievable by one example of an interference projection system according to the present invention.

FIG. 5a is a schematic ray diagram illustrating the maximum lateral field size $y_{max}$, (i.e., the maximum field size in the y-direction) achievable by one example of an embodiment of an interference projection system according to the present invention. As described in greater detail below, in embodiments of the present invention where the beam width is sufficiently large, the temporal coherence length of the source provides a limitation on lateral field size $y_{max}$.

In such embodiments, the temporal coherence length $$L_t \sim \lambda^2/\Delta\lambda \text{(where } \Delta\lambda \text{ is the bandwidth of the source);} \quad \text{equation 6}$$

is proportional to the maximum lateral field size $y_{max}$. In regions of the photosensitive surface 150 that exceed the maximum lateral field size the interference pattern will disappear.

Sub-beams 515a and 515b represent portions of beams 115a and 115b (visible in FIG. 4), wherein at the intersection of 515a and 515b at surface 150 an interference pattern will occur. The edges of the field IP and IP' occur where the difference in the optical path length to a given point of intersection on surface 150 equals the temporal coherence length $L_t$. Beyond IP and IP', the temporal coherence is exceeded and the interference pattern disappears. Accordingly, in the y-dimension the maximum lateral field size is $$Y_{max} = L_t/\sin\theta; \quad \text{equation 7}$$

For example, the source bandwidth in an excimer laser can easily approach 1 pm giving $L_t \sim ½$ cm and a maximum lateral field size on the order of 1 cm for $\theta=\theta_1=\theta_2=60$ degrees.

In the x-direction the field size of the interference pattern is limited by the beam widths of beams 115a and 115b in the x-direction.

Figure 5B:
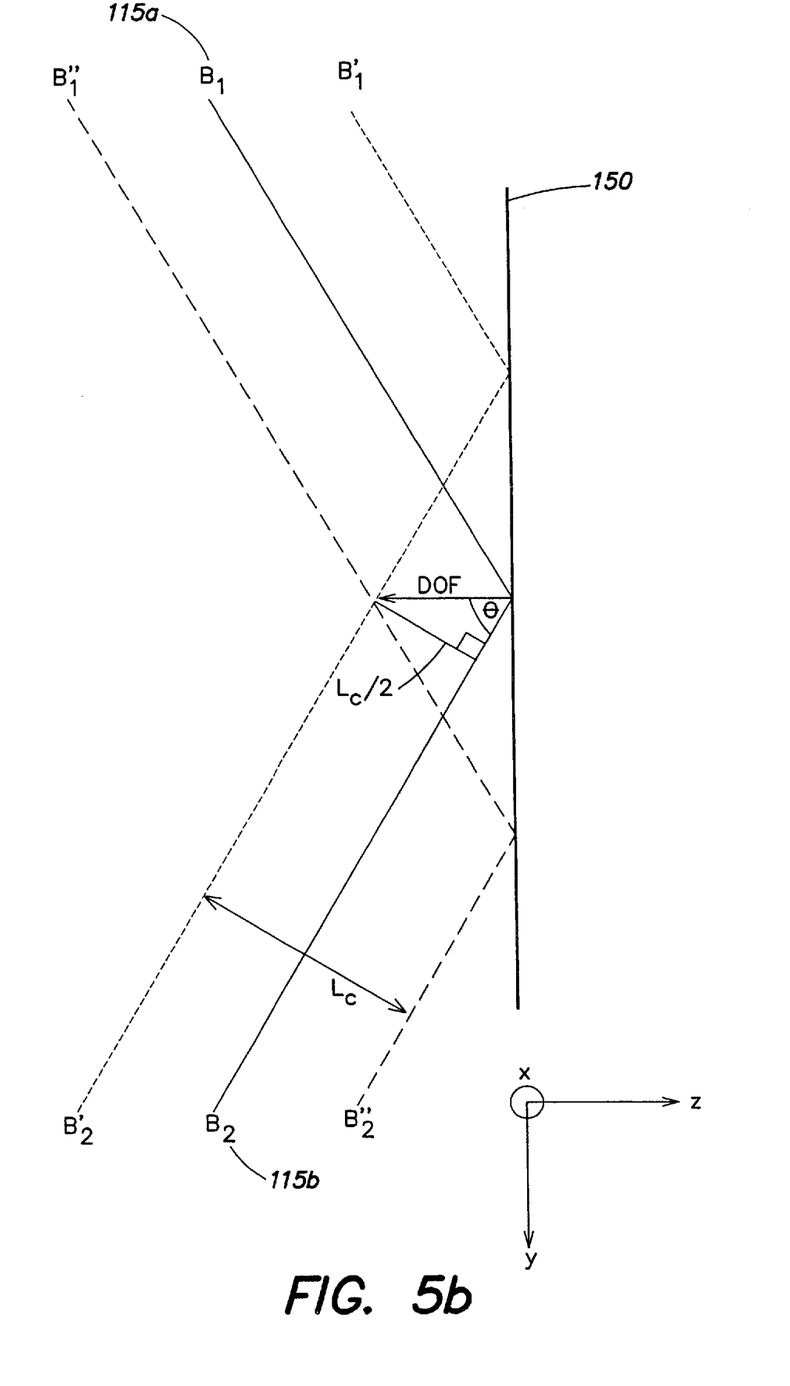
FIG. 5b is a schematic ray diagram illustrating the depth of field achievable by one example of an interference projection systems according to the present invention.

FIG. 5b is a schematic ray diagram illustrating the depth of field DOF achievable by exemplary interference projection systems according to the present invention. The depth of field is a measure of how far surface 150 can be displaced in the z-direction and still allow interference to occur at surface 150. Although one boundary of the depth of field is illustrated to occur at a distance DOF from surface 150, it should be understood that a second boundary exists at a distance DOF in the opposite direction along the z-axis from surface 150. A surface located such that the two boundaries are located symmetrically about the surface 150 is said to be located at the "nominal field position." In FIG. 5b, surface 150 is assumed to be at nominal position.

In FIG. 5b, depth of field DOF is the depth of field corresponding to a point at the intersection of rays $B_1$ and $B_2$, where $B_1$ and $B_2$ represent arbitrary rays in beams 115a and 115b. Rays $B_1'$ and $B_1''$ are separated by a distance equal to the lateral spatial coherence length $L_C$ and are located symmetrically about ray $B_1$. Similarly, rays $B_2'$ and $B_2''$ are separated by a distance equal to the lateral spatial coherence length $L_C$ and are located symmetrically about ray $B_2$. As discussed with reference to FIG. 4, beams 115a and 115b have the same orientation.

In the illustrated exemplary embodiment of an interference projection system according to the present invention, the depth of field DOF can be seen to be $$DOF = (L_C/2)/\sin\theta; \quad \text{equation 8.}$$

In addition to understanding the boundaries within which an interference pattern will occur under nominal positioning of the components of projection systems, it is possible to characterize the principal sources of error which can degrade interference pattern contrast due to non-nominal positioning of the components. The primary sources of dynamic error in the exemplary embodiments of projection systems are pulse-to-pulse changes in the angle of the input beam 105 (visible in FIG. 2), and torsional vibrations of components of the interference projection system. Both of these errors result in a shift in the input beam angle by a small amount which may vary from pulse to pulse. Static errors due to machining tolerances and the misalignment of optical elements will add a static component to the error. Tolerance of the system to errors in the input beam angle serves as useful figure of merit.

As one of ordinary skill in the art would understand, ray tracing simulations can be used to determine the sensitivity of the imaging (i.e., interference pattern projection) performance to angular deviations of the input beam. For each location on the photosensitive surface 150 (visible in FIG. 2) where the two interfering beams 115a and 115b (visible in FIG. 2) overlap, two positions on the input beam can be calculated, each position corresponding to a point on the input beam from which light at a location of intersection was generated; two such positions exist on the input beam, one for each of beams 115a and 115b. As one of ordinary skill will understand, if the distance between the two positions is less than the lateral coherence length, and the optical path difference through the system for each position is less than the temporal coherence length, interference will occur.

It is also instructive to examine the system sensitivity analytically. For any optical system consisting of reflective and refractive elements, a deviation of $e_i$ in the input angle of an input beam 105 (visible in FIG. 2) will cause an equal deviation in all downstream rays. One exemplary aspect of the interference projections according to the present invention which have two pairs of mirrors 250 and 275 (visible in FIG. 2) is that an angular error $e_i$ causes one arm to intersect the image plane at angle $\theta+e_i$ and the other at $\theta-e_i$. This is a general result not limited to small values of $e_i$. This error is referred to as phase error. The period of the interference pattern (equation 5) thus becomes $$\Lambda = \frac{\lambda}{2\sin\theta\cos e_i}; \qquad \text{equation 9}$$

and for $e_i \ll 1$ $$\Lambda \approx \Lambda_0(1-e_i^2); \qquad \text{equation 10}$$

where $\Lambda_0$ is the period for the system with no angular deviation. Thus, the change in the period is second order in $e_i$. In contrast, in a conventional interferometric projection system design, the angle of the arms at the image plane both shift in the same direction (i.e. both angles are either $\theta+e_i$ or $\theta-e_i$) giving, for $e_i \ll 1$ $$\theta \approx \theta_0(1-e_i \cot\theta+e_i^2/2); \qquad \text{equation 11}$$

which is first order in $e_i$. This period change causes the image to be out of phase with the interference image for $e_i=0$ by an amount which varies linearly with the distance y from the center of the exposed area $$\Delta\phi = \frac{\pi e_i^2 y}{\Lambda(1-e_i^2)}; \qquad \text{equation 12}$$

This limits the size of the field to regions where $\alpha\phi \ll \pi$ or $$y_{\max} \ll \Lambda\left(\frac{1}{e_i^2}-1\right); \qquad \text{equation 13}$$

A second effect of angular error in the input beam 105 (visible in FIG. 2) is that interfering beams 115a, b (visible in FIG. 2) will not be in alignment at surface 150 (visible in FIG. 2), i.e. the interfering beams will originate from different points on the input beam. This error is referred to as offset error. It can be shown that for an angular shift $e_i$, the origin of a beam will shift by $le_i$ where l is the beam path length between the source 202 (visible in FIG. 2) and surface 150 (visible in FIG. 2) for $e_i=0$. The separation between the two points at the input plane is thus $$e_i(l_L - l_R) = e_i \Delta l; \qquad \text{equation 14}$$

This separation must be less than the lateral coherence length of the source. The optical path length is a useful upper bound to the physical path length which gives a further limitation on the lateral field size $$y_{\max} < \frac{L_c}{2e_i \sin\theta}; \qquad \text{equation 15}$$

Figure 6:
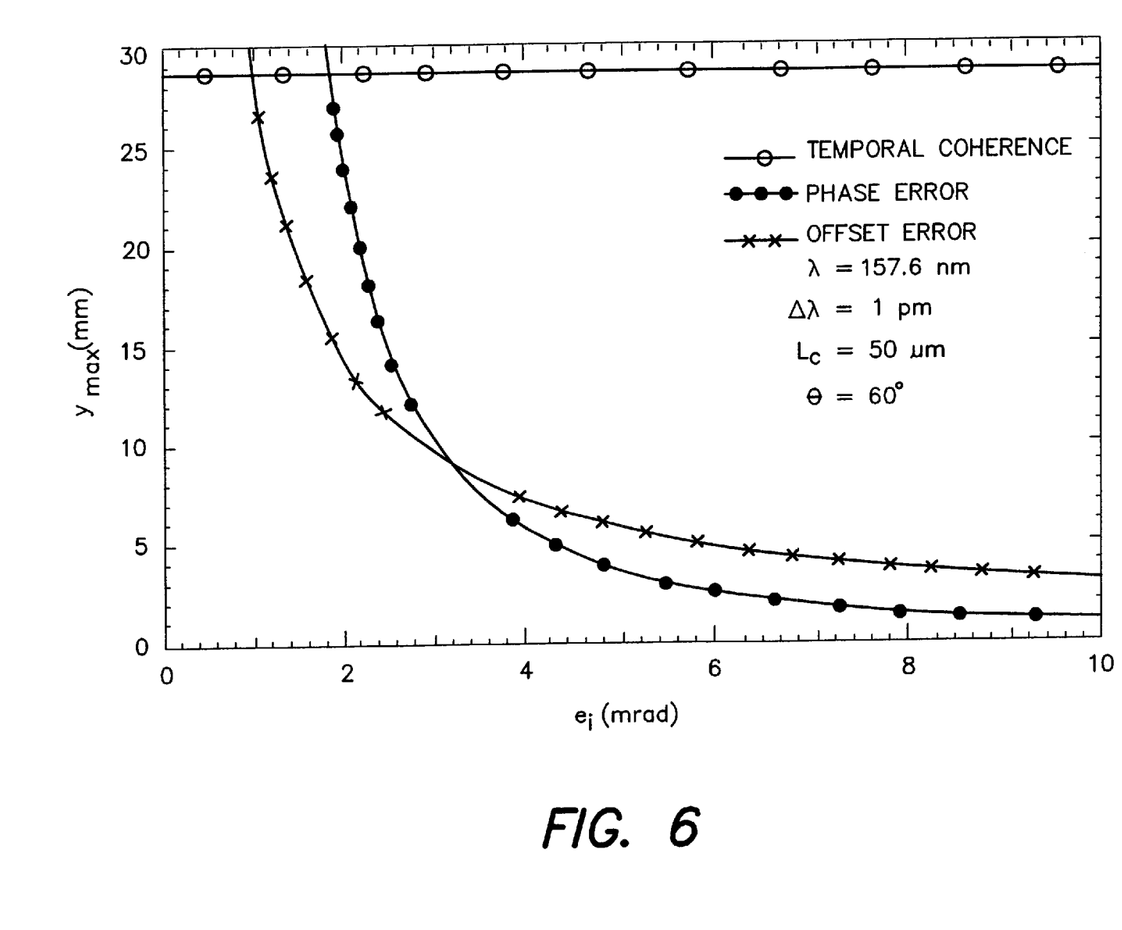
FIG. 6 is a graphical representation of the effect of phase error and offset error as a function of angular deviation, for one example of one embodiment of an interference projection system according to the present invention.

FIG. 6 is a graphical representation of the effect of phase error and offset error on $y_{max}$ as a function of angular deviation $e_i$ for one embodiment of an interference projection system according to the present invention. For values of $e_i$ between 0.0 mrad and approximately 1.0 mrad, $y_{max}$ is limited by temporal coherence. For values of $e_i$ between approximately 1.0 mrad and approximately 3.0 mrad, $y_{max}$ is limited by offset error, and for values of $e_i$ of approximately 3.0 mrad and greater, $y_{max}$ is limited by phase error.

Having thus described the inventive concepts and a number of exemplary embodiments, it will be apparent to those skilled in the art that the invention may be implemented in various ways, and that modifications and improvements will readily occur to such persons. Thus, the examples given are not intended to be limiting. The invention is limited only as required by the following claims and equivalents thereto.

What is claimed is:

1. An interference projection system having an input beam, comprising:
   a non-diffractive first module which reflects and refracts the input beam, and splits the input beam into a first beam and a second beam; and
   a non-diffractive second module which causes the first beam and the second beam to interfere at a surface, the first and second modules combining to have the first beam and the second beam reach the surface with the same orientation.

2. The interference projection system of claim 1, wherein at the first module output, the first beam and the second beam propagate in substantially parallel directions, and wherein at a plane normal to the directions, the first beam and the second beam have traversed substantially the same optical path length.

3. The interference projection system of claim 1, wherein at the first module output, the first beam and the second beam have the same orientation.

4. The interference projection system of claim 1, wherein the first module TE polarizes both the first beam and the second beam.

5. The interference projection system of claim 1, wherein the second module includes a first mirror to reflect the first beam, and a second mirror to reflect the second beam.

6. The interference projection system of claim 1, wherein the second module includes a first pair of mirrors to reflect the first beam, and a second pair of mirrors to reflect the second beam.

7. An interference projection system having an input beam, comprising:
   a first etalon having a first etalon front surface and a first etalon back surface, the first etalon back surface being separated from the first etalon front surface, the first etalon being oriented relative to the input beam to split the beam into a first beam and a second beam;
   a second etalon having a second etalon front surface and second etalon back surface, the second etalon back surface being separated from second etalon front surface, the second etalon being oriented relative to first beam and the second beam to reflect the first beam and second beam; and
   a first pair of mirrors oriented to cause the first beam and the second beam to interfere at a surface, the first pair of mirrors comprising a first mirror oriented to reflect the first beam and a second mirror oriented to reflect the second beam,
   the first etalon, second etalon, and first pair of mirrors, being selected and arranged to have the first beam and second beam have the same orientation at the surface.

8. The interference projection system of claim 7, wherein the first etalon is configured to produce a first beam derived from the input beam by reflecting the input beam from the first etalon front surface, and to produce a second beam derived from the input beam by reflecting the input beam from the first etalon back surface.

9. The interference projection system of claim 8, wherein the second etalon is configured to reflect the first beam from the second etalon back surface, and to reflect the second beam from the second etalon front surface.

10. The interference projection system of claim 9, wherein the first etalon front surface is oriented to TE polarize the first beam and the second etalon front surface is oriented to TE polarize the second beam.

11. The interference projection system of claim 9, wherein the first beam and the second beam emerge from the second etalon traveling in substantially parallel directions.

12. The interference projection system of claim 9, wherein the first beam and the second beam emerge from the second etalon having substantially the same signal strength.

13. The interference projection system of claim 11, wherein at a plane normal to the directions, the first beam and the second beam have traversed substantially the same optical path length.

14. A method of projecting an interference pattern, comprising:

projecting a beam;

non-diffractively dividing the beam by reflecting and refracting the beam to produce a first beam and a second beam;

intersecting the first beam and second beam to form an interference pattern at a surface, the dividing and intersecting steps combining to have the first beam and second beam reach the surface with the same orientation.

15. The method of projecting an interference pattern of claim 14, wherein the first beam and the second beam produced during the dividing step propagate in substantially parallel directions, and at a plane normal to the directions, have traversed substantially the same optical path length.

16. The method of projecting an interference pattern of claim 14, wherein the first beam and second beam produced by the dividing step are TE polarized.

17. An interference projection system to receive an input beam, comprising:

a non-diffractive first module configured and arranged to reflect and refract the input beam, and split the input beam into a first beam and a second beam; and a non-diffractive second module configured and arranged to cause the first beam and the second beam to interfere at a surface, the first and second modules configured to have the first beam and the second beam reach the surface with the same orientation.

18. The interference projection system of claim 17, wherein the first module is configured such that at the first module output, the first beam and the second beam propagate in substantially parallel directions, and such that at a plane normal to the directions, the first beam and the second beam have traversed substantially the same optical path length.

19. The interference projection system of claim 17, wherein at the first module output, the first beam and the second beam have the same orientation.

20. The interference projection system of claim 17, wherein the first module is configured to TE polarize both the first beam and the second beam.

21. The interference projection system of claim 17, wherein the second module includes a first mirror configured and arranged to reflect the first beam, and a second mirror configured and arranged to reflect the second beam.

22. The interference projection system of claim 17, wherein the second module includes a first pair of mirrors configured and arranged to reflect the first beam, and a second pair of mirrors configured and arranged to reflect the second beam.

* * * * *